(12) United States Patent
Colburn et al.

(10) Patent No.: US 6,930,034 B2
(45) Date of Patent: Aug. 16, 2005

(54) ROBUST ULTRA-LOW K INTERCONNECT STRUCTURES USING BRIDGE-THEN-METALLIZATION FABRICATION SEQUENCE

(75) Inventors: Matthew E. Colburn, Hopewell Junction, NY (US); Elbert E. Huang, Tarrytown, NY (US); Satyanarayana V. Nitta, Poughquag, NY (US); Sampath Purushothaman, Yorktown Heights, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/331,038

(22) Filed: Dec. 27, 2002

(65) Prior Publication Data

US 2004/0127001 A1 Jul. 1, 2004

(51) Int. Cl.$^7$ ........................................... H01L 21/4763
(52) U.S. Cl. ...................................... 438/619; 438/637
(58) Field of Search .............................. 438/584, 597, 438/618, 619, 620, 622, 623, 637, 586

(56) References Cited

U.S. PATENT DOCUMENTS

| 6,017,814 A | * | 1/2000 | Grill et al. .................. 438/619 |
| 6,261,942 B1 | * | 7/2001 | Zhou et al. .................. 438/619 |
| 6,265,321 B1 | * | 7/2001 | Chooi et al. ................. 438/725 |
| 6,346,484 B1 | * | 2/2002 | Cotte et al. .................. 438/725 |
| 6,413,852 B1 | * | 7/2002 | Grill et al. ................... 438/619 |
| 2002/0127844 A1 | * | 9/2002 | Grill et al. ................... 438/622 |
| 2005/0062165 A1 | * | 3/2005 | Saenger et al. .............. 257/774 |

FOREIGN PATENT DOCUMENTS

JP    2004214648 A    *    7/2004    ......... H01L/21/768

* cited by examiner

Primary Examiner—Olik Chaudhuri
Assistant Examiner—Michael K. Luhrs
(74) Attorney, Agent, or Firm—Daniel P. Morris, Esq; Harrington & Smith, LLP

(57) ABSTRACT

A method for fabricating low k and ultra-low k multilayer interconnect structures on a substrate includes: a set of interconnects separated laterally by air gaps; forming a support layer in the via level of a dual damascene structure that is only under the metal line; removing a sacrificial dielectric through a perforated bridge layer that connects the top surfaces of the interconnects laterally; performing multilevel extraction of a sacrificial layer; sealing the bridge in a controlled manner; and decreasing the effective dielectric constant of a membrane by perforating it using sub-optical lithography patterning techniques.

19 Claims, 12 Drawing Sheets

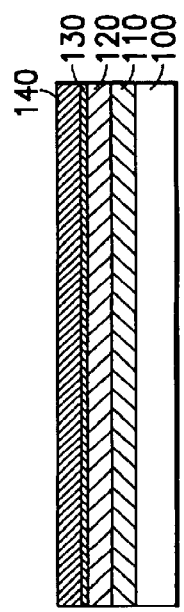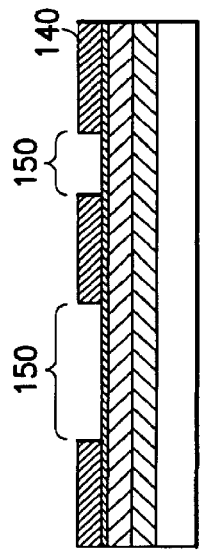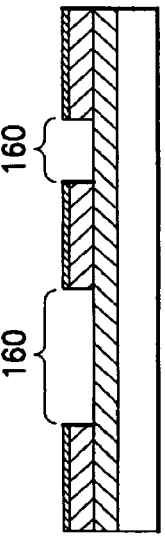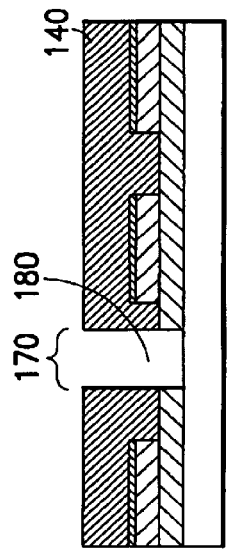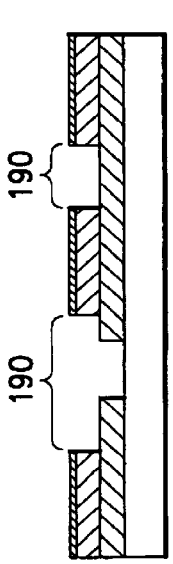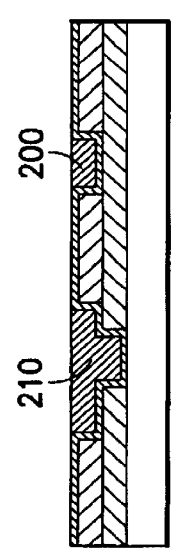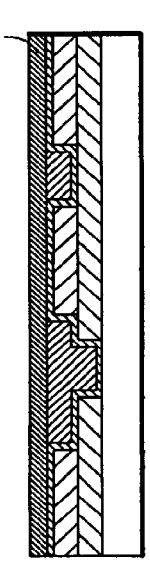
FIG. 1
PRIOR ART

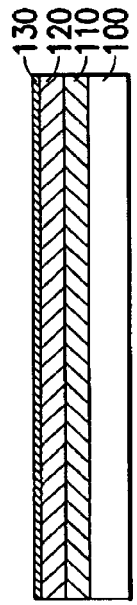
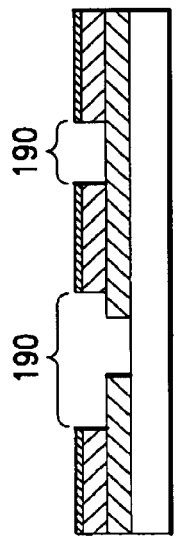
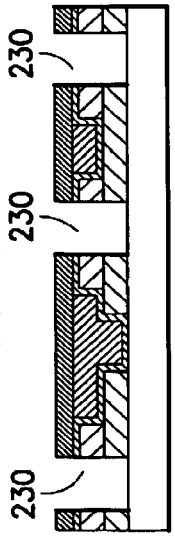
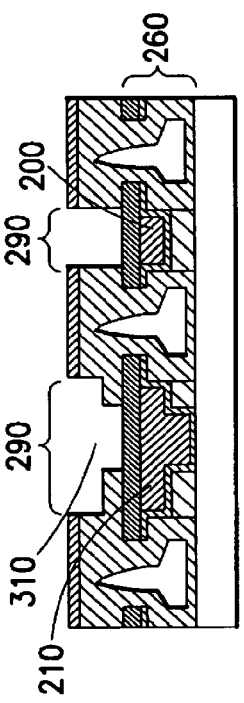
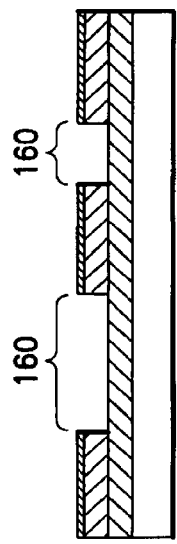
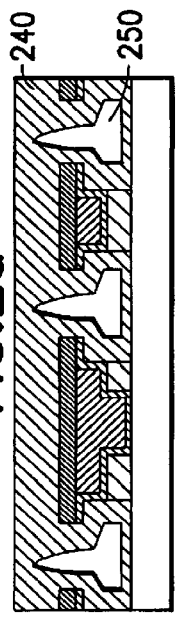
FIG. 2
PRIOR ART

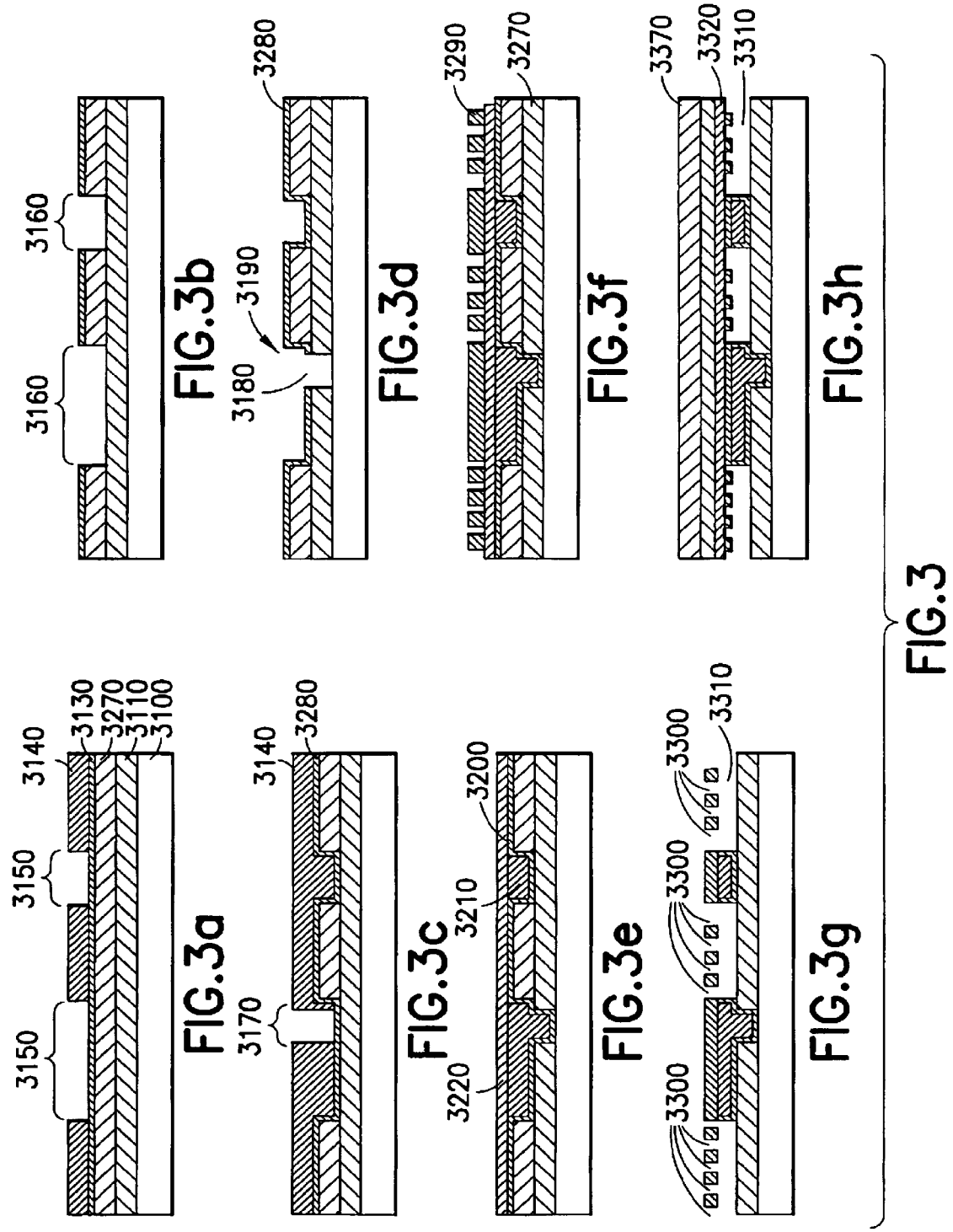

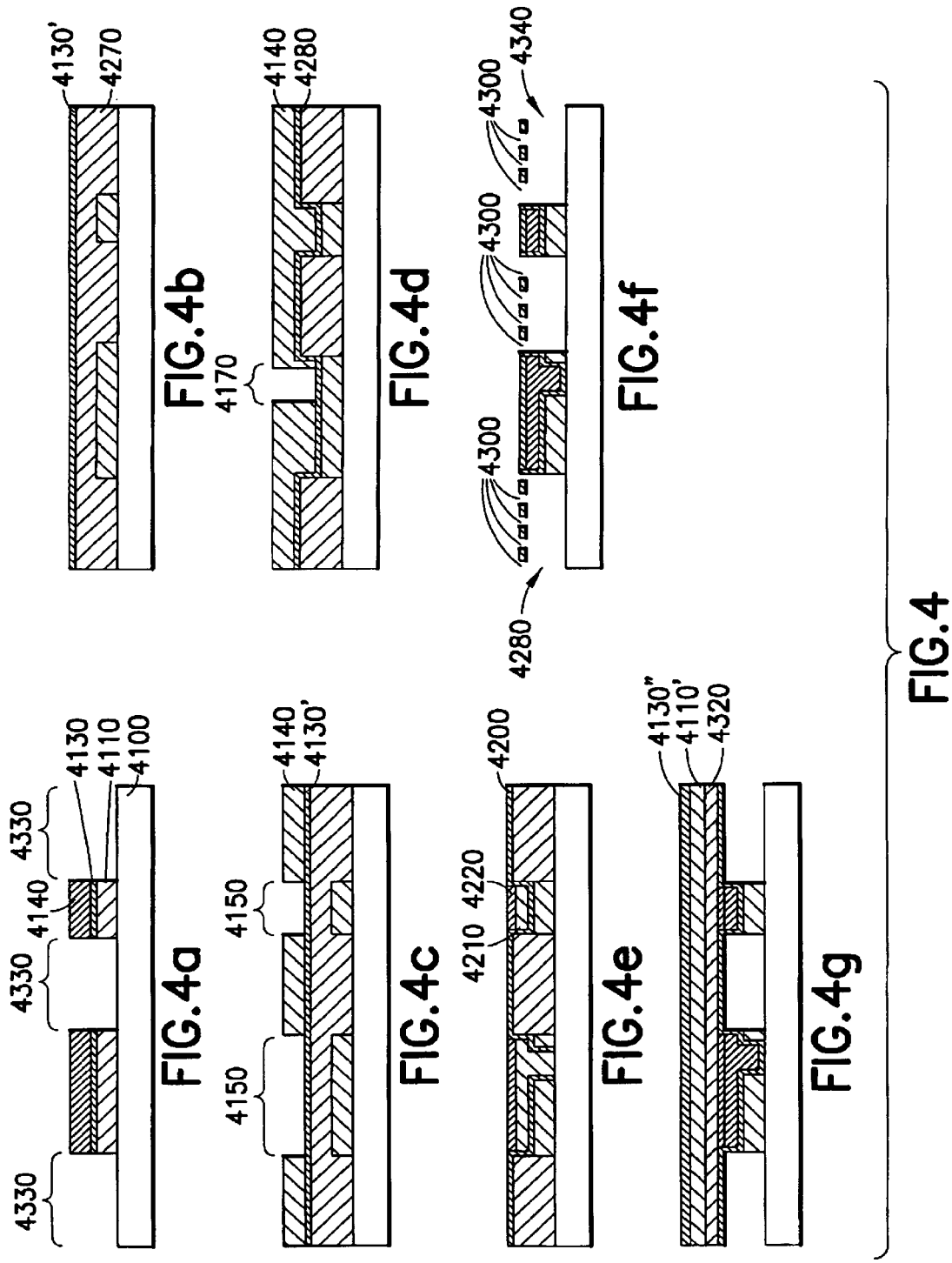

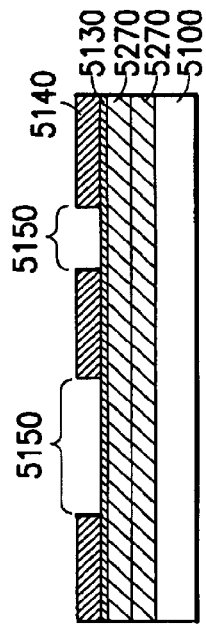
FIG.5a
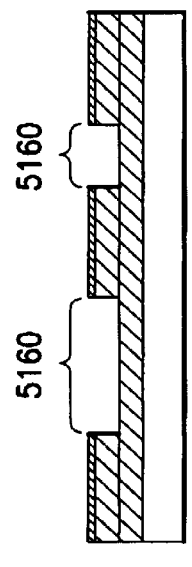
FIG.5b
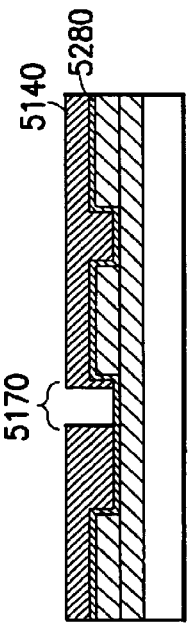
FIG.5c
FIG.5d
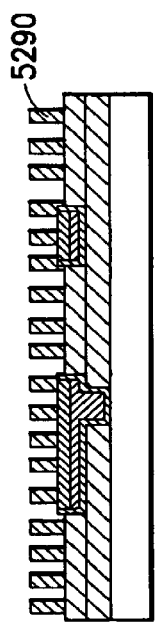
FIG.5e
FIG.5f
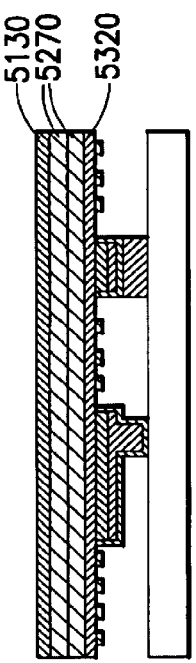
FIG.5g
FIG.5

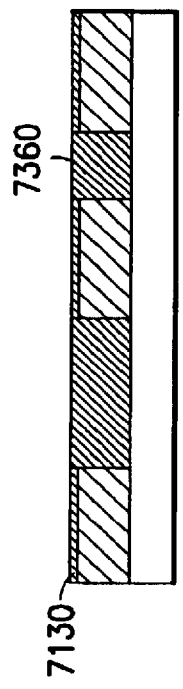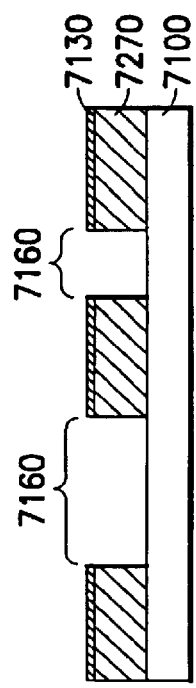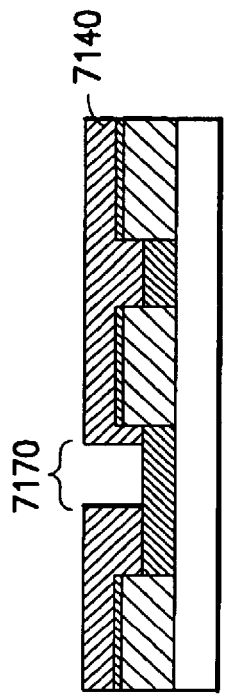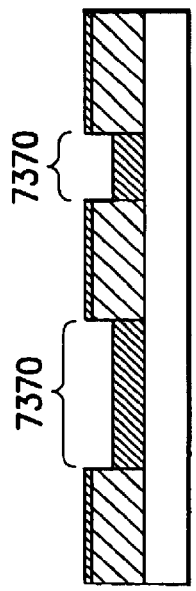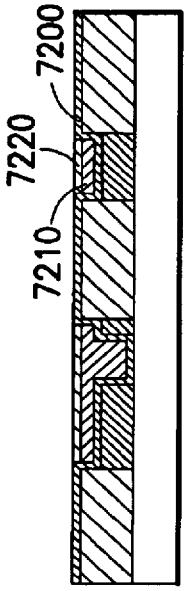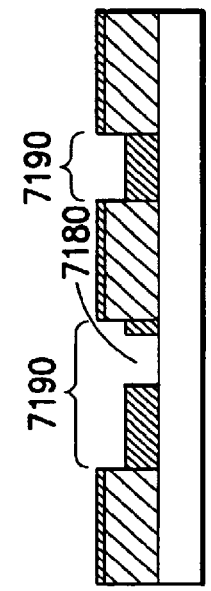
FIG. 7

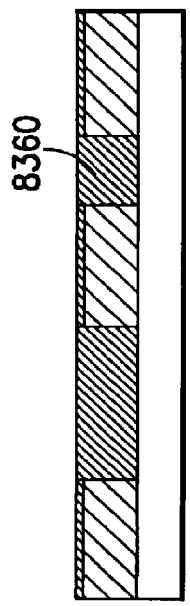
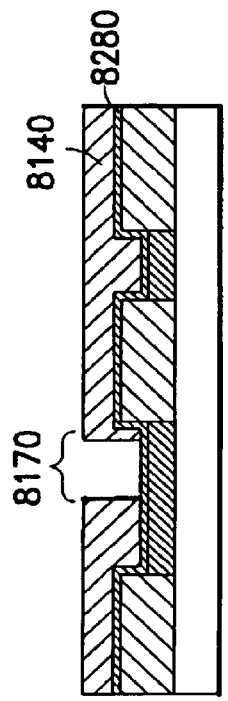
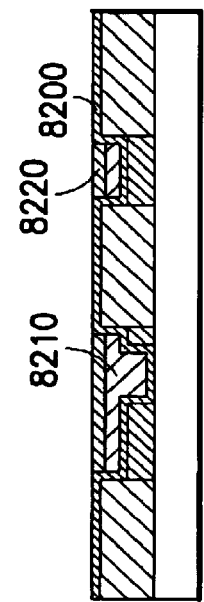
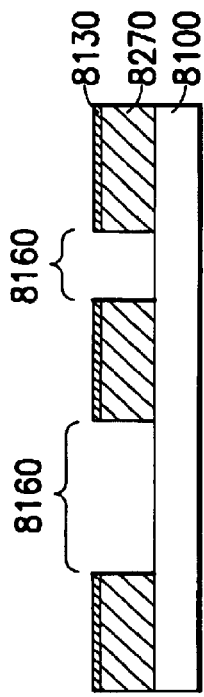
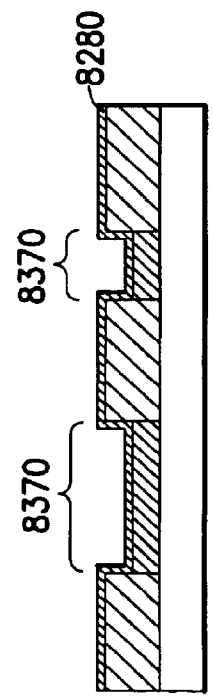
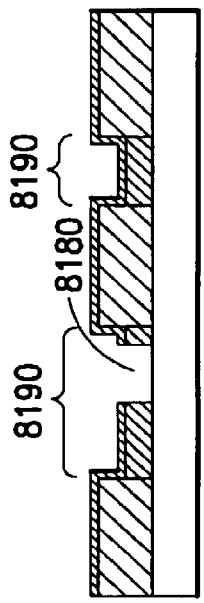
FIG. 8

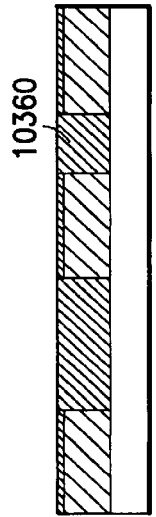
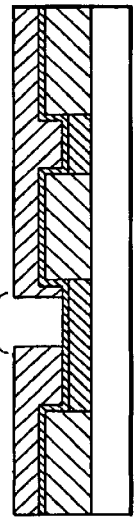
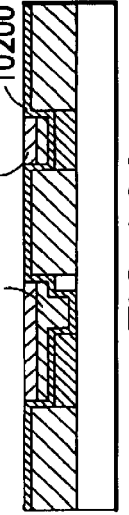
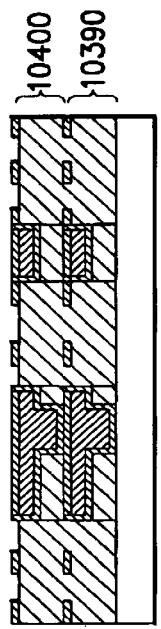
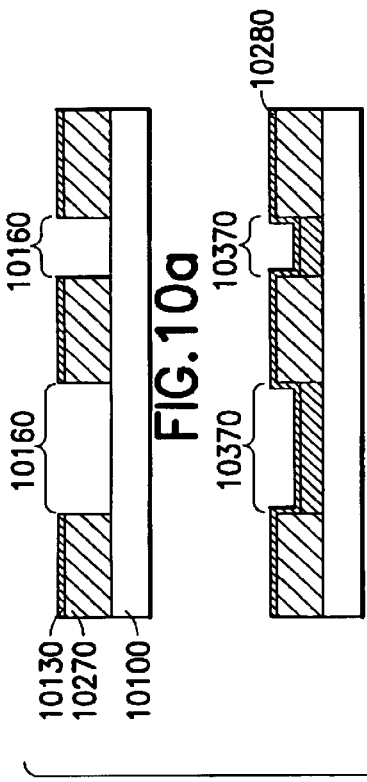
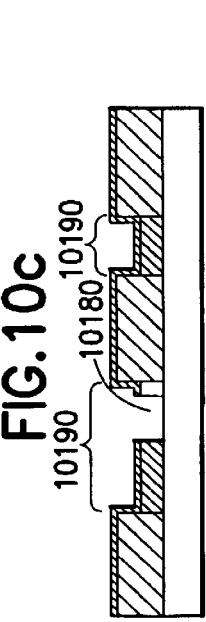
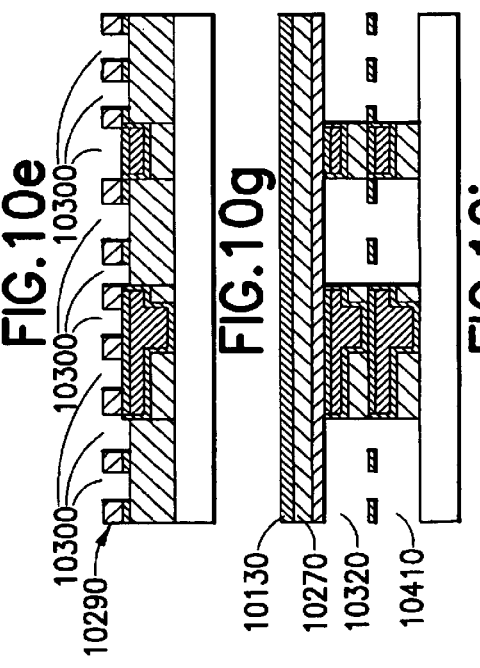
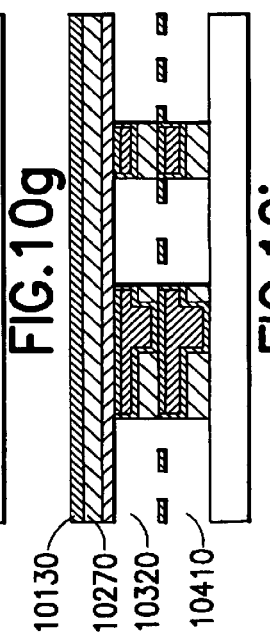
FIG. 10

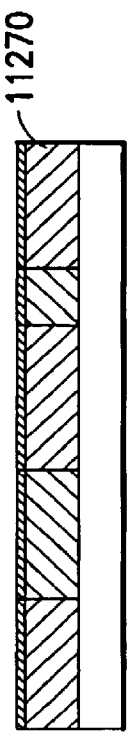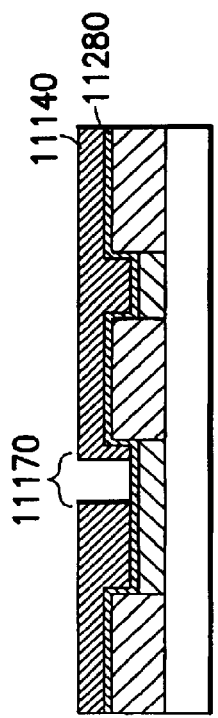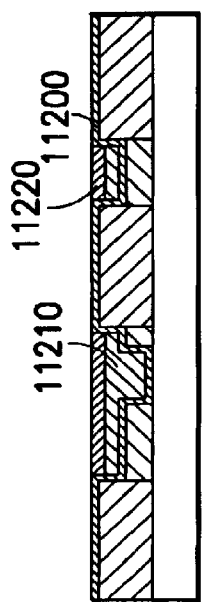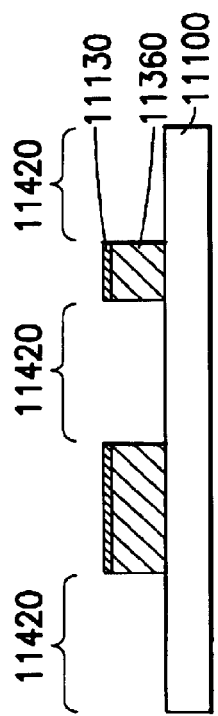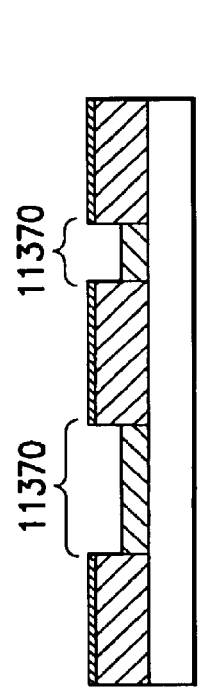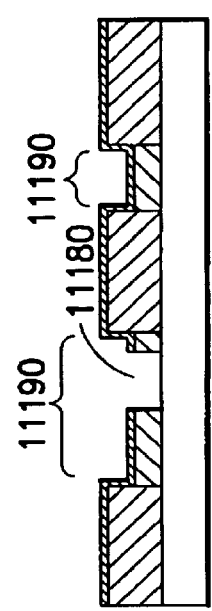
FIG. 11

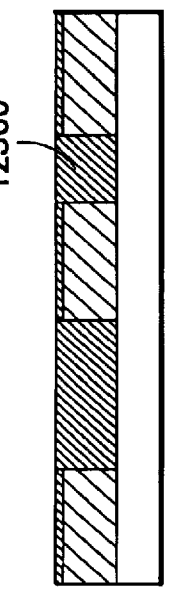
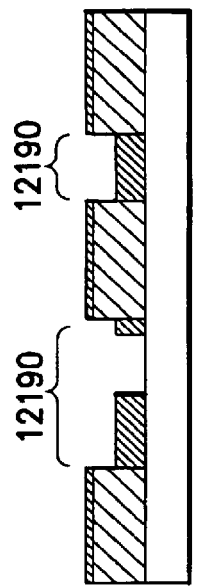
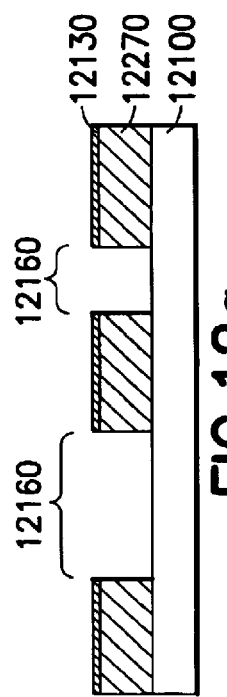
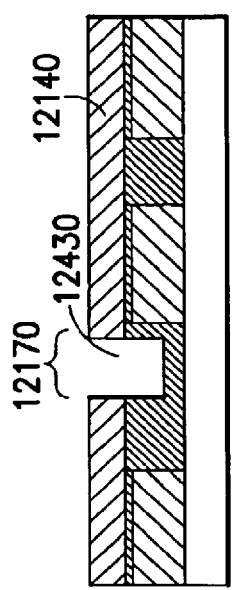
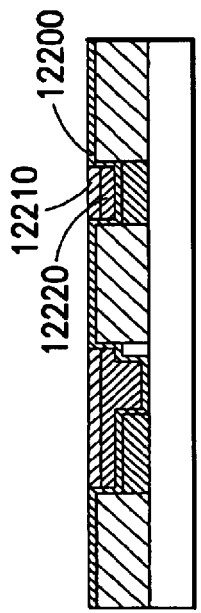
FIG. 12

ROBUST ULTRA-LOW K INTERCONNECT STRUCTURES USING BRIDGE-THEN-METALLIZATION FABRICATION SEQUENCE

FIELD OF THE INVENTION

The present invention pertains to the process of producing intralayer and interlayer air-bridge structures in Very-Large Scale Integrated (VLSI) and Ultra-Large Scale Integrated (ULSI) devices and high performance packaging.

BACKGROUND OF THE INVENTION

The fabrication of Very-Large Scale Integrated (VLSI) or Ultra-Large Scale Integrated circuit (ULSI) requires metallic wiring that connects individual devices in a semiconductor chip, to one another. One method of creating this wiring network on such small scale is the dual damascene (DD) process schematically shown in FIG. 1. In the standard DD process, an interlayer dielectric (ILD), shown as two layers 110, 120 is coated on the substrate 100, FIG. 1a. The via level dielectric 110 and the line level dielectric 120 are shown separately for clarity of the process flow description. In general, these two layers can be made of the same or different insulating films and in the former case applied as a single monolithic layer. A hard mask layer 130 is optionally employed to facilitate etch selectivity and to serve as a polish stop as will be seen later. The wiring interconnect network consists of two types of features: line features that traverse a distance across the chip, and the via features which connect lines in different levels together. Historically, both layers are made from an inorganic glass like silicon dioxide ($SiO_2$) or a fluorinated silica film deposited by plasma enhanced chemical vapor deposition (PECVD).

In the dual damascene process, the position of the lines 150 and the vias 170 are defined lithographically in photoresist layers, 140, depicted in FIGS. 1b and 1d, and transferred into the hard mask and ILD layers using reactive ion etching processes. The process sequence shown in FIG. 1 is called a Line-first approach because the trench 160 which will house the line feature is etched first, see FIG. 1c. After the trench formation, lithography is used to define a via pattern 170 in the photoresist layer 140 which is transferred into the dielectric material to generate a via opening 180, FIG. 1d. The dual damascene trench and via structure 190 is shown in FIG. 1e after the photoresist has been stripped. This structure 190 is coated with a conducting liner material or material stack 200 that serves to protect the conductor metal lines and vias and serve as an adhesion layer between the conductor and the ILD. This recess is then filled with a conducting fill material 210 over the surface of the patterned substrate. The fill is most commonly accomplished by electroplating of copper although other methods such as chemical vapor deposition (CVD) and other materials such as Al or Au can also be used. The fill and liner materials are then chemically-mechanically polished (CMP) to be coplanar with the surface of the hard mask and the structure at this stage is shown in FIG. 1f. A capping material 220 is deposited over the metal or as a blanket film, as is depicted in FIG. 1g to passivate the exposed metal surface and to serve as a diffusion barrier between the metal and any additional ILD layers to be deposited over them. Silicon nitride, silicon carbide, and silicon carbonitride films deposited by PECVD are typically used as the capping material 220. This process sequence is repeated for each level of the interconnects on the device. Since two interconnect features are defined to form a conductor in-lay within an insulator by a single polish step, this process is designated a dual damascene process.

As with any circuit, semiconductor chips are prone to signal propagation delays which depend on the product of the line resistance, R, and the interconnect capacitance, C. In order to improve the performance of semiconductor chips, manufacturers have reduced the resistivity of the metal used in fabrication by replacing aluminum wiring by copper. By moving to lower dielectric constant (k) materials, manufacturers have also begun to reduce the capacitance, C, in the circuit. The common terminology used to describe the dielectric films is to classify them as standard k (4.5<k<10), low k (k<3.0), ultra low k (2.0<k<2.5) and extreme low k (1.5<k<2.0). Ultra low k and extreme low k dielectrics generally tend to be porous with intentionally engineered voids in their structure. Since the lowest dielectric constant possible is defined by air or vacuum ($k_{vac}=1$), many have developed means to produce voids in the dielectric. When the void volume extends and occupies substantial contiguous regions of the gaps between the lines one achieves an interconnect structure wherein the lines are nominally separated by air or vacuum as the ILD material. In the following descriptions the term air bridge is used to describe such an interconnect structure to distinguish it from structures wherein the ILD is porous with void volume dispersed within a nominally contiguous solid dielectric.

One prior art approach to air bridge construction is shown in FIG. 2. In this process, a low-k structure is constructed after metal deposition steps to form the interconnects, as for example by a DD process. For the purpose of reference, these types of processes are designated in the present application as Metal-then-Air Bridge (MAB) approaches consistent with the process sequence used. Most processes that follow this approach begin with the standard DD fabrication sequence. Thus the FIGS. 2a, 2b, 2c and 2d replicate the process flow in FIGS. 1a, 1b, 1c, 1d, 1e and 1f, albeit in an abbreviated manner. Thus, for example, the structure shown in FIG. 2d is identical to the DD structure shown in FIG. 1f. After the standard DD structure is thus completed, openings are defined lithographically in all or a selected subset of the gaps between the interconnect line features and etched into the top surface of the capping layer 220 and the hardmask layer 130. These openings are parallel to the line edges and are then used to remove the underlying ILD to create inter-metal line cavities 230 running the length of the lines as shown in FIG. 2e. Chemical vapor deposition (CVD) or plasma enhanced CVD (PECVD) of a dielectric film 240 such as silicon oxide is then performed to form a conformal coating on the inside of the cavity as well as to cause a pinch point near the cavity entrance thus, creating the air-bridge structure 250 shown in FIG. 2f. Additional levels are then fabricated in the same manner above the air bridge level as shown in FIG. 2g.

These MAB approaches require extensive knowledge and manipulation of the CVD or PECVD processes used to deposit the pinch off dielectric 240 and will pose significant difficulties for interconnects with varying line pitch. For example, wider inter-line gaps will require much thicker film deposition for pinch off than the narrower ones, thereby requiring compromises. Further, as the line widths and spacings decrease in future technology generations, the fraction of the gap between the lines occupied by the conformal sidewall coating can become large thus increasing the inter-line capacitance. Since the deposition is performed after the initial structure is constructed, depending on the aspect ratio of the gaps, some portions of the sidewall may not be covered which leads to reliability issues of exposed metal lines or metal vias. Further, most MAB processes require a layer by layer air bridge formation. Therefore, the integrity of the air-bridge cavity may be breached when subsequent processes to build upper interconnect layers are carried out. For example, referring to FIG. 2g, if the via portion 310 of an upper level 290 is not perfectly aligned to an underlying metal line 210 of the first level, the via etch may open through the bridge into the air gap below. In this case when METALLIZATION of the upper level is performed, the air gap below will be filled with metal causing electrical shorts between the lines.

It is therefore clear that an alternate approach that will circumvent the above detailed limitations of the MAB approaches is required in order to fabricate reliable multi-level air bridge structures.

SUMMARY OF THE INVENTION

The invention relates to a variety of extreme low k interconnect structure comprising a conductor that is encased in a dielectric sheath, is supported transversely by a bridge member extending to an adjacent interconnect line and is supported vertically by vias and a dielectric support that is either continuous or patterned to lie only under the metal lines. The regions between the adjacent conductor lines is occupied by air (air bridge structures) or an ultra low k, an extreme low k or a low k dielectric.

In one embodiment of the invention, a self-aligned support dielectric layer provides structural rigidity and a deposited sidewall and bridge layer is formed before the formation of the conductor features, thereby forming a bridge layer between the tops of the conductors and a passivation layer, respectively.

In another embodiment of the invention, the regions between the conductors are either filled with an ultra-low k dielectric or by a sacrificial dielectric that can be extracted to form air gaps between the lines.

The foregoing and other objects, features and advantages of the invention as well as presently preferred embodiments thereof and the best known techniques for fabricating integrated circuit structures in accordance with the invention will become more apparent from a reading of the following description in connection with the accompanying drawings.

BRIEF DESCRIPTION OF THE DRAWINGS

FIG. 1. Schematic view of the steps in the Dual Damascene (DD) Process (Prior Art)

FIG. 2. Schematic view of a prior art Metal-then-Air Bridge Approach (MAB).

FIG. 3. Schematic process flow for the Layer Support Air Bridge-then-Metal (LsABM) Approach.

FIG. 4. Schematic process flow for the Patterned Support Air Bridge-then-Metal (PsABM) Approach.

FIG. 5. Schematic process flow for the Air-Bridge-then-Metal (ABM) Approach.

FIG. 7. Schematic process flow for the Line Etch-First, Self-Aligned Integrated Build (SAIB-LF).

FIG. 8. Schematic process flow for the Line Etch-First, Self-Aligned Integrated Build with Bridge (SAIB-LFB).

FIG. 11. Schematic process flow for the Line Etch-First, Self-Aligned Integrated Build with Bridge using an Alternative Tone (SAIB-LFBA) approach.

FIG. 12. Schematic process flow for the Via Etch-First, Self-Aligned Integrated Build with Bridge (SAIB-VF) approach.

DETAILED DESCRIPTION OF THE INVENTION

Figure 6:
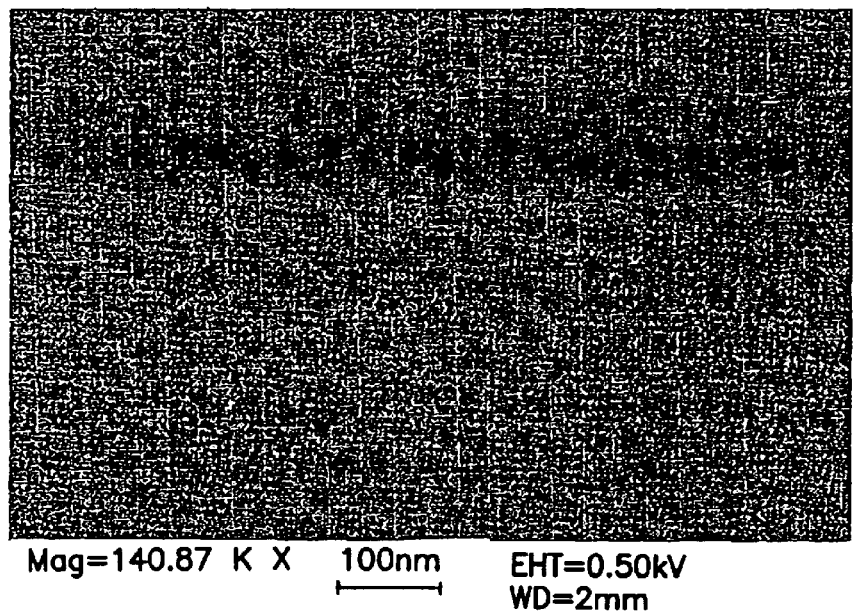
FIG. 6. Scanning electron micrograph showing an array of small holes on a Bridge Layer.

The first embodiment of our inventive approach, which is part of the larger category we denote as an Air-Bridge-then-Metal (ABM) approach, is detailed in FIG. 3. The process starts with the standard line first DD process steps but deviates prior to metallization. The ILD can also be tailored to generate a variety of final structures. In this first inventive structure, the Layered Support Air-Bridge-then-Metal structure (LsABM), the ILD comprises a bilayer stack with two dielectric layers 3110 and 3270, selected such that there is good reactive ion etch (RIE) selectivity between the two materials. An example would be an organic layer 3270 over an inorganic glass 3110. Additionally a hard mask 3130 comprising one or more layers is deposited on the ILD layer 3270 and a line level pattern 3150 is lithographically produced in a photoresist 3140 as in the standard DD process, FIG. 3a. In the next step, the line level pattern is etched into the dielectric layer 3270 to form a line level trough 3160, and the resist 3140 is removed, FIG. 3b. A dielectric bridge layer 3280, is deposited conformally over the structure at this point and then a via pattern 3170 is generated lithographically, FIG. 3c. The via pattern is etched through the bridge layer and the via-level ILD to form the via opening 3180 and the resulting dual damascene structure 3190, FIG. 3d. The liner layer 3200 is deposited over the structure followed by metal fill 3210 and the surface is polished down to the top of the bridge material and a capping layer 3220 is deposited over the structure as a blanket film, as is depicted in FIG. 3e. Optionally, the cap layer 3220 can be deposited selectively only on the metal line features using, for example, the methods described in copending IBM applications.

Next an array pattern stencil of small holes 3290 is formed on top of the cap layer using photoresist or a method employing diblock copolymer phase separation and etching as shown in FIG. 3f. Illustratively, the cap layer over the metal is left unpatterned to protect the metal. If the cap layer were formed only over the metal and also was etch resistant, then the small hole pattern could be uniform. The term "small holes" is interpreted to mean less than the relevant ground rule for closest distance. The holes may be sublithography (for standard photon lithography). Techniques such as e-beam or short wavelength photons may also be used to define a mask for the holes. An upper limit for the hole size will be set by the availability of a material to pinch off the holes to provide a solid base for the next layer. The inventors have formed arrays of holes of diameter less than 14 nm. The small hole array is replicated into the cap, hardmask and the bridge layers followed by the extraction of the line level ILD 3270 leaving behind air 3310 as the ILD thus resulting in the air-bridge structure shown in FIG. 3g. The sacrificial ILD material 3270 may be removed by several methods. These methods may include wet or dry etching processes, thermal cycles, irradiation, super critical fluid based extraction, and the like.

This process generates an Air Bridge 3300 between the lines and has a solid planar via-level support 3110. The small holes are pinched off by an optional cap layer 3320, and the next level ILD coatings 3310 and 3370 as shown in FIG. 3h. Since the extraction holes are by design small and uniform in size, pinch off occurs uniformly and is independent of the pattern density variations in the line level below. This approach does not address overlay or breach problem specifically but addresses reliability by making sidewall thickness uniform. Further, the line gaps may be filled with inert gases such as N2, Ar, He, SF6 just prior to pinch off.

A second inventive embodiment, the Patterned Support Air-Bridge-then-Metal (PsABM), can be constructed if the bilayer ILD stack is deposited in the manner depicted in FIG. 4, so that in the final structure there is a layer of support dielectric only under metal lines. First, the bottom layer of the ILD stack 4110 is deposited with an optional hard mask layer 4130. Photoresist 4140 is applied and patterned and the pattern transferred into the hard mask 4130 and the ILD 4110 to form the topography 4330 shown in FIG. 4a. The ILD material 4110 is typically the dielectric material that would be used as the via level dielectric in the constructs described in FIGS. 1 and 2 and the line support dielectric layer 3110 shown in FIG. 3. Ideally, the remaining ILD is located at the positions where we later expect to have the interconnect metal lines. The second layer of the ILD stack 4270 is then deposited over the patterned first layer of the ILD stack after the resist and hard mask are stripped. This second layer may require a polishing step to planarize it or to achieve a requisite thickness of the layer and a hard mask layer 4130 is applied on top, FIG. 4b. The line level pattern is then formed on a photoresist layer 4150 on the hard mask 4130, FIG. 4c. The pattern is transferred in to the hard mask 4130 and ILD 4270 and a conformal bridge layer 4280 is deposited on top of which the via level pattern is formed in a photoresist 4140, see FIG. 4d. The conformal dielectric can be deposited by CVD, PECVD or even spin coating and curing as required. The via pattern is transferred into the line support ILD 4110 by RIE and the metallization, metal CMP and capping processes are done as in the LsABM process flow to achieve the structure shown in FIG. 4e. FIG. 4e illustrates a structure with a selective cap 4220 formed only on top of the metal line features. Steps similar to those shown in FIGS. 3f and 3g can then be performed to form an array of uniform sized small holes in the cap, bridge and hard mask layers followed by the extraction of the ILD 4270 from the inter-line spaces resulting in the air bridge structure 4340 shown in FIG. 4f. The next level build can then proceed on top of this air bridge by the coating of the optional barrier layers 4320, the via level dielectric for the next level 4110 and the next optional hard mask 4130 as shown in FIG. 4g. The PsABM structure formed by this method has a lower effective k than the LsABM process which is an ABM process with a solid via level, by virtue of the complete rather than partial replacement of all the dielectrics that originally fill the inter-line gaps with air. Additional lowering of the effective k can be enabled by using selective cap layers rather than blanket dielectric caps.

The lowest effective k structure, the full Air-Bridge-then-Metal structure (ABM), shown in FIG. 5, is produced by using an ILD stack that comprises a single sacrificial material (5270). The process flow is generally similar to the LsABM and the PsABM-processes except that a full air bridge 5350 is formed such that the lines and the vias are surrounded by air gaps upon extraction of the sacrificial material; i.e. in the final structure, lines are only supported by vias and the perforated layer 5330. The sacrificial material is designed to be strong enough to withstand the rigors of CMP while allowing for extraction. Due to the absence of a dielectric support under the lines, it is preferable to optionally provide mechanical support vias (metal) wherever feasible without causing shorting between upper and lower level wiring.

The innovative processes described above have the benefit of forming a precise topography, defined by lithography and etching, upon which the bridge material is deposited prior to metallization. In a sense, the bridge layer acts as a protective coating which is incorporated into the structure and wraps around the metal lines in the final interconnect. Additionally, since mETALLIZATION is performed over the bridge, the metal is more uniformly protected by the bridge as compared to the protection offered by the sidewall dielectric that is deposited during the pinch off step in the MAB prior art scheme. The bridge layer can be selected to provide the best possible protection of the metal lines while possessing a low k value but need not perform a pinch off function as in the case of the bridge layers used in the prior art MAB schemes. Consequently, the bridge material is selected and deposited in a fashion that is not constrained by pattern density or pinch off and thus a wider choice of materials and processes are possible. As mentioned before, by virtue of using a regular array of small size holes to extract the sacrificial material, the pinch off process is made more controllable and independent of the pattern density in the line level below.

Further, if the sacrificial material (3270, 4270) used in the above processes, LsABM, PsABM, or ABM, is replaced by a low k, permanent ultra low k or extreme low k material (one that is not extracted), these processes can be used directly for ultra low k and extreme low-k integration schemes with a robust support layer and the added benefit of having the bridge material conformally protecting the metal lines. This type of integration decouples the dielectric properties of the ILD from the reliability constraints of semiconductor chips. This affords a trade off to achieve higher reliability at the cost of a nominal increase in the effective k due to the presence of the bridge and support layers.

In the ABM, PsABM and LsABM approaches, extraction of the sacrificial material through the bridge layer can be performed after each interconnect level or at the end of fabrication of several interconnect layers followed by a single extraction to produce a multilevel air bridge structure. The latter approach circumvents the myriad of issues related to the breaching of air bridges during a multilevel build that was described in relation the prior art MAB process flow. In the case of LsABM process, extraction done after multilevel build requires that the support layer have adequate permeability to the species evolved from the sacrificial layer during the extraction process. The optional step of producing small holes 3300, 4300, 5300 in FIGS. 3, 4 and 5 respectively, in the air-bridge structure may be accomplished in many ways. The hole pattern stencil (3290, 4290 and 5290) can be formed lithographically, whether the imaging is done by electron, x-rays, extreme ultraviolet, ion, or deep ultraviolet photons. Various technologies known to the art such as imprint lithography, soft lithography, nanocrystals such as CdSe and Si, self-assembly processes, spinoidal decomposition or phase separation of polymer blends, copolymers, block copolymers, or composites may also be used to form the holes. For example, poly(methyl methacrylate)-b-(polystyrene), poly(dimethylsiloxane)-b-(caprolactone), and other block copolymer or blend systems that phase separate may be used to produce a "self-patterned" (e.g. holes isolated from one another) structure on the surface of the substrate.

One method of patterning the bridge layer is by selectively removing one component of a diblock copolymer structure and using it as an etch mask for the bridge layer. Using a diblock copolymer film that has phase separated, one phase of the film is selectively removed to leave a pattern with a regular array of holes 9290 that have nanometer scale dimensions.

These patterns can then be transferred into the cap, bridge and hard mask layers. In some circumstances the patterned polymer may be incorporated directly into the final structure. An example of the hole formation by diblock copolymer on a sacrificial material—bridge layer stack is shown in FIG. 6.

While the structures shown in FIGS. 1–5 each have their benefits, it is also desirable to produce a support structure in line with metal lines that is rigid without the use of additional lithography steps as is the case in the PsABM process. The following innovative methods teach an Air-bridge-then-Metal methodology to produce a self-aligned support beneath the metal lines without additional lithography. The first inventive process flow, the Self-Aligned Integrated Build (SAIB), produces a structure with rigid self-aligned dielectric supports under the line and a more fragile low k, ultra low k, or extreme low k material between the lines. This results in a low or ultra low effective k interconnect with keff below 3.0. If the material between the line is sacrificial and is extracted to form an air bridge then the process is called the Self-Aligned Air Bridge build (SAAB) and the final structure is an air bridge interconnect.

The desired SAIB process is one in which the support is 1) self-aligned under the line level metal, 2) is extendible to ultra-low-k and extreme low k dielectric layers, 3) able to protect the metal and the ultra low k and extreme low k dielectrics from harsh process conditions such as solvents or etchants, and 4) capable of withstanding subsequent processing required to fabricate upper level interconnects. The order of the process steps also has implications on the uniformity, repeatability, and precision of the structures.

There are two preferred embodiments of the SAIB process: i) the Line First Self-Aligned Integrated Build (SAIB-LF), shown in FIG. 7, and ii) the Line First Self-Aligned Integrated Build with Bridge (SAIB-LFB), shown in FIG. 8. These processes address the disadvantages of the many prior art metal-first approaches to generating heterogeneous dielectric structures. The goal is to produce a precise, uniform low-k structure that can be reproduced layer by layer and a structure that can be extendible to ultra low k and extreme low k materials, without extra lithographic steps.

In the first preferred embodiment of the SAIB process, labeled SAIB-LF, shown in FIG. 7, the line level lithography and reactive ion etch are performed, generating a line trench 7160 that extends into both the via and line level layer in the dielectric material 7270, FIG. 7a. The dielectric 7270 is preferably a low k, ultra low k or extreme low k dielectric material. This gap 7160 is then filled with a support material 7360 and planarized by CMP to be coplanar with the surface of the hardmask layer 7130, FIG. 7b. A reactive ion etch is performed to remove an appropriate amount of the support 7370 such that the remaining thickness equals the via level thickness, FIG. 7c. Optionally, the hardmask may also be removed at this step by changing etch gas chemistries as needed. Alternatively, wet etch processes may be used to produce this recess. A photoresist 7140 is spin coated on the surface of the hardmask and of etched support material. The resist is imaged with the via pattern 7170 and developed, FIG. 7d. A bilayer or trilayer lithography scheme may have benefits over a single layer resist for this application due to the topography. The via pattern is then etched through the underlying support layer to generate the via opening 7180 and the dual damascene-like dielectric stack structure 7190, FIG. 7e. The hardmask 7130 still protects the dielectric material 7270 and may optionally be removed to reduce the effective dielectric constants. The liner 7200 and the metal fill 7210 are deposited and polished by CMP to the surface of the hardmask. The cap layer 7220 is then deposited over the metal, as a blanket film or optionally as a selective layer only over the line metal features, as a depicted in FIG. 7f. The important result is that the line support layer is self-aligned and robust and as a result the structure is now mechanically stable and can withstand subsequent processing. The inter-line dielectric is selected for its low k values and ability to withstand the DD CMP step with the assistance of the support layer so that the final structure shown in FIG. 7f can be produced. Since the support layer is formed in a self-aligned fashion within the line pattern in one lithographic step, they coincide on to each other exactly.

The second preferred embodiment of the SAIB approach, denoted as SAIB-LFB, is characterized by the addition of a bridge layer in the line first SAIB process. As shown in FIG. 8, in this case, the line level lithography and reactive ion etch are again performed generating a line trench pattern through both the via and line level in the dielectric material 8270. The dielectric 8270 is preferably a low k, ultra low k or extreme low k dielectric material. This line trench 8160 is then filled with a support material 8360 and chemically-mechanically polished to the surface of the hardmask layer 8130. A RIE step is performed to remove an appropriate amount of the support. Optionally, the hardmask may also be removed at this step by changing etch gas chemistries as needed. A bridge layer 8280 is then deposited conformally over the entire surface. This protects the structure during any lithography rework. A photoresist 8140 is spin coated on the surface of the bridge material. The resist is imaged with the via pattern 8170 and developed. A bilayer or trilayer lithography scheme may have benefits over a single layer resist for this application due to the topography. The via pattern is then etched through the support layer and the bridge material creating the via opening 8180 and thus completing the dual damascene structure 8190, FIG. 8e. This allows for contact to the underlying line level. The liner 8200 and the metal 8210 are deposited and polished down to the surface of the bridge material 8280. An alternative process for the SAIB-LFB is to remove the bridge during the CMP so that it remains only on the sidewalls and the bottom of the line trenches. This will reduce the effective k of the interconnect structure. A metal or dielectric cap 8220 is then deposited either selectively over the metal, as is shown in FIG. 8f, or a dielectric cap covering the entire top surface as a blanket film is deposited. The metal lines are thus protected from any ambient species (solvents, moisture and the like) that are present and easily permeate through the ultra low k or extreme low k ILD 8270 during subsequent processing or during actual use of the devices. The bridge also conformally lines the sidewalls of the low k and ultra low k dielectric thus mitigating the problem of metal penetration into the dielectric layer 8270 through any exposed or open pores that intersect the sidewall profiles.

Other processes are capable of producing a dual damascene structures with a low k or ultra low k dielectric between the lines while having the rigid support under lines. However, the two SAIB embodiments above achieve this same goal without exposing metal lines to harsh process conditions such as reactive ion etch, and without additional lithography steps beyond the two required to define the two levels of a DD dielectric stack by photolithography. This process ensures the integrity of the structures during build by creating the support layer below the lines prior to the deposition and CMP of the metal. This accommodates the use of mechanically weak ultra low k and extreme low k dielectric materials. Additionally, the second embodiment protects the dielectric material by creating the bridge prior to the via-lithography step. In addition to the advantages described above, the conformal bridge layer protects the structure from oxidation during resist rework processing. Perforating the bridge layer, as performed in the ABM processes, is a means to reduce the effective k further after the bridge has successfully protected the metal lines during the fabrication process.

The self-aligned integrated build approach can be extended to air bridge structures if material between the metals lines (8270 in FIG. 8 of the SAIB-LFB method) is sacrificial. The desired process is one in which an air bridge structure is created and is supported. Preferably, the supports are self-aligned under the line level metal; the bridge protects both the metal lines and the dielectric from harsh process conditions such as solvents or etchants; and the structure is capable of withstanding subsequent processing. The order of the process also has implications on the uniformity, repeatability, and precision of the structures.

Figure 9:
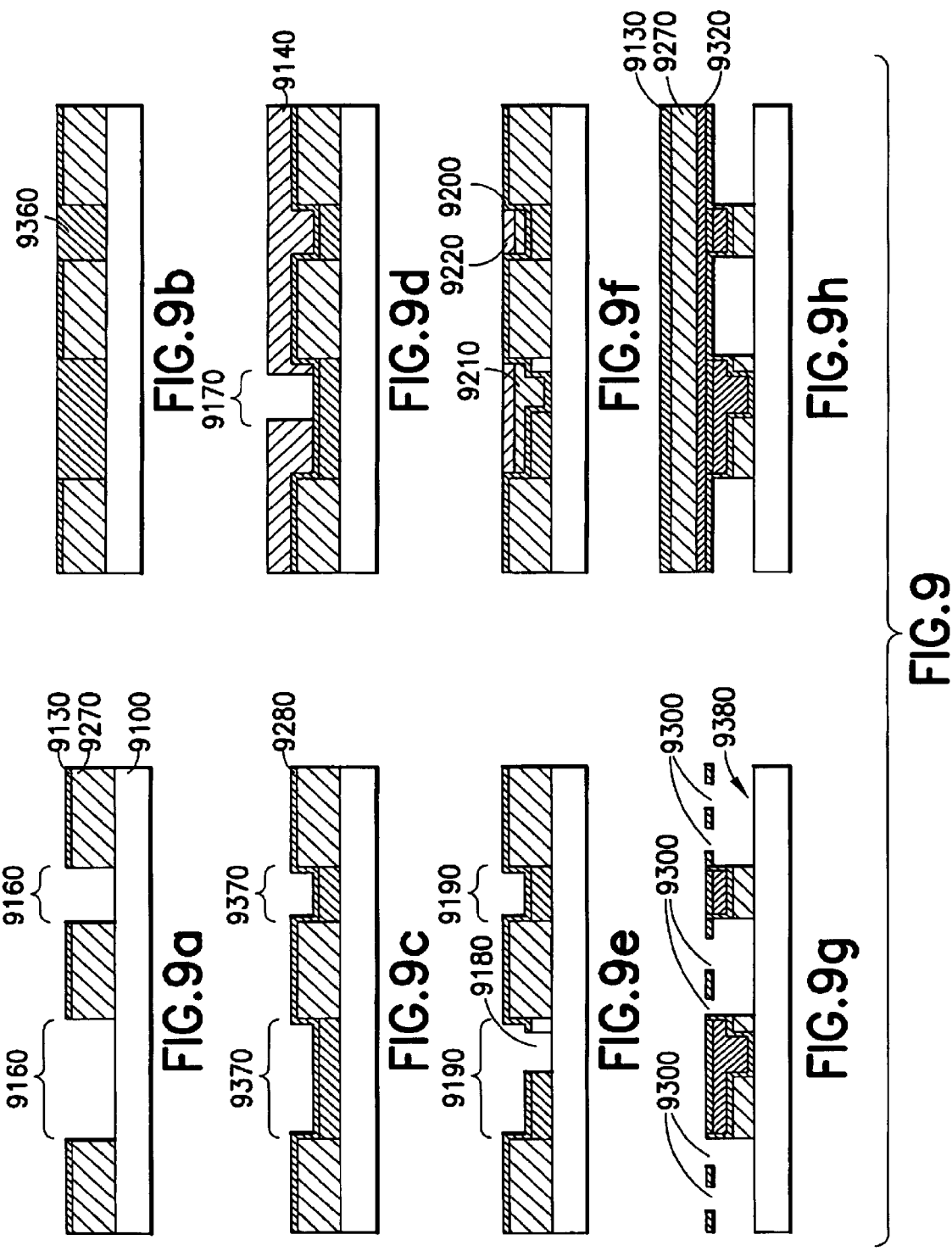
FIG. 9. Schematic process flow for the Self-Aligned Air Bridge (SAAB) formation with Level-by-Level Extraction FIG. 10. Schematic process flow for the Self-Aligned Air Bridge formation with Multilevel Extraction (SAAB-MLE)

One preferred embodiment, the Self-Aligned Air Bridge (SAAB), is shown in FIG. 9. For the SAAB process, the dielectric material 8270 used in the SAIB processes is replaced by a material 9270 that is sacrificial. The sacrificial material 9270 is chosen to be removable in a selective fashion with respect to the bridge layer and the support layer. The sacrificial material may actually be the same material as could be used in the SAIB-LFB process if this extraction constraint is met.

The SAAB process begins just as the SAIB-LFB process. The line level lithography and reactive ion etch is performed, generating a line trench through both the via and line levels in the sacrificial material 9270. This gap 9160 is filled with a support dielectric material 9360 which is chemically-mechanically polished to the surface of the hardmask layer 9130 which is on the sacrificial material 9270. A RIE is performed to remove an appropriate amount of the support 9370 within the line trench; some or all of the hardmask may be optionally consumed during this RIE. The depth of the RIE is set by the line thickness. Then, a bridge layer 9280 is deposited conformally over the entire surface. This protects the dielectrics during lithography rework or RIE. A photoresist 9140 is spin coated on the surface of the bridge layer. The resist is imaged with the via pattern and developed. The via pattern 9170 is then etched to the depth of the underlying metal structure so metallic contact can be made. The resulting via opening 9180 is positioned in the support material 9360 and generates the dual damascene structure 9190. As in the SAIB processes, a bilayer or trilayer lithography scheme may have benefits over a single layer resist for this application due to the topography. The liner 9200 and the fill metal 9210 are deposited and polished to the surface of the bridge material. A conductive or insulating cap layer 9220 is deposited either selectively over the metal, as is depicted in FIG. 9f, or a blanket dielectric cap film is coated over the entire top surface. The bridge layer and if used, the blanket cap layer, can be patterned with holes 9300 to enable the subsequent extraction of the sacrificial material.

One method of patterning the bridge layer is by selectively removing one component of a diblock copolymer structure and using it as an etch mask for the bridge layer. Using a diblock copolymer film that has phase separated, one phase of the film is selectively removed to leave a pattern with a regular array of holes 9290 that have nanometer scale dimensions. This hole array is then etched into the optional full cap and the bridge creating a perforated film 9300. The underlying material is then amenable to a removal process required to generate an air gap spanned on top by a perforated dielectric layer. The removal of the sacrificial material can occur after each wiring level build thus generating a single level air bridge 9380, see FIG. 9g, upon which other levels can be built, as in FIG. 9h. Preferably, extraction can occur after building several levels 10390, 10400 to form a multilevel air-bridge 10410 as shown in FIGS. 10a to 10i. Building multilevels and extracting a single time, enhances the manufacturability of the process by eliminating the effect of via misalignment that can lead to electrical short defects. It is preferable to perform the multilevel extraction at a level where the pattern size of the line is larger, so that the prospect of via misalignment is minimized. Another benefit is that the number of CMP exposures that the air bridges see are reduced further enhancing manufacturability.

The SAIB and SAAB processes detailed above show the support material (7360, 8360, 9360 and 10360) being coated into a patterned material (7270, 8270, 9270, 10270). The processes can also be performed in the opposite tone (see FIG. 11) in which the sacrificial material 11270 is coated over the patterned support material 11360. Once the structure is planarized, the support material can be etched to the depth of the via level generating the recess 11370. This leaves the same structure as the SAIB processes with the hardmask removal step practiced. Once this structure is formed, the process continues in sequence with the deposition of the optional bridge 11280, generation of the via 11180, deposition of the liner 11200 and the conductive filler metal 11210, CMP of layers 11210 and 11200, and deposition of the cap 11220. For the air-bridge applications the bridge may be perforated to augment sacrificial material extraction.

The SAIB and SAAB processes can also be performed in a via-first manner. One embodiment is shown by way of example in FIG. 12. The lower k or sacrificial material 12270 is coated over the substrate 12100. A hardmask stack 12130 is deposited over the top of it. Lithography is used to create a line pattern that is etched into the support material such that the gap 12160 is created, FIG. 12a. A support material 12360 is spin coated over the surface of the topography. It is polished flush to the surface of the hardmask, FIG. 12b. Lithography is then used to create a via pattern 12170 that is etched into the support to create the partial via 12430, FIG. 12c. The etch is continued such that a dual damascene structure 12190 is generated, FIG. 12d. A bridge layer may be optionally deposited at this juncture. A liner 12200 is deposited followed by a metal 12210 deposition. The metal is polished to the surface of the hardmask 12130. A cap layer 12220 is deposited selectively over the metal features only as shown in FIG. 12e or as a blanket film. Subsequent processing is then possible as described in the various embodiments described above to achieve ultra low k or extreme low k interconnects or air bridge interconnects.

The sacrificial and support layer materials can be selected from inorganic and organic dielectrics as long as there is selectivity between the two during the extraction step for the air bridge processes. Examples of sacrificial materials include polymethylmethacrylate, polybutadiene, polystryene, parylenene, polyethylene oxide, poly ureathanes, poly carbosilanes, poly silizanes, poly methylene oxide, poly(norborene), teflon, polyethylene, crosslinked unsaturated polymers, porous crosslinked polymers, linear polymers, branched polymers, hyperbranched polymers, dendritic polymers, aliphatic polymers, and aromatic polymers, diamond-like carbon (DLC), methylsilsesquioxanes, hydrosilsequioxanes, dimethylsiloxanes, functionalized dimethylsiloxanes, and inorganic polymers, inorganic glasses, and spin-on-glasses. These materials may be removed by supercritical solvent extraction, thermolysis, oxidation, liquid dissolution phase reduction, reactive ion etch, wet chemical etch, electron beam assisted decomposition, UV degradation, electron cission, ion damage. The support layer material choices include organic dielectrics such as SiLK; silicon dioxide, class of PECVD low k dielectrics containing Si,C,O and H, spin on glasses such as methylsilsesquioxanes, hydrosilsequioxanes, or mixed silsesquioxanes; and porous versions of all of the above materials.

The line level pattern in the sacrificial (SAAB), or low K (SAIB) material can be performed using direct patterning of the material by lithography, reactive ion etch of a pattern into the material, or deposition of the material over a pattern. Multilayer resist lithographic schemes may improve the process window for patterning both the line and the via levels. Positive and Negative tone imaging schemes or the use of tailored hardmask stacks other than those described may also be used.

The bridge material must survive the extraction step and may consist of multiple stacks of different materials or graded films. Examples of bridge layer materials include but are not limited to silicon dioxide, silicon carbide, silicon nitride, silicon oxynitride, methylsilsesquioxane, hydrosilsesquioxane, parylene, funtionalized parylene, polysilizanes, polycarbosilane, poly dimethylsiloxane, silylated organic polymers, polyhalocarbons, polyfluorocarbons, tetraethylorthosilicate, spin-on-glasses, high Tg polymers, CVD polymer films, organic and inorganic CVD films, and inorganic and organic PECVD films containing Si, C, O or H. Examples of applicable precursors include but are not limited to silane, monofunctional to multifunctional alkylsilanes, cyclic siloxane precursors, acetylene, fluorocarbons, halocarbons, or any other polymerizing chemistries or combinations there of. Ideally, the bridge layer possesses good thermal stability and acts as good dielectric and good diffusion barrier. Since it wraps around multiple lines it should not be conductive once fully processed.

The support material can be any material that selectively withstands the sacrificial material extraction process. Several examples are diamond-like carbon, crosslinked organic polymers (aliphatic and aromatic), porous organic films (aliphatic and aromatic), silicon dioxide, silicon carbide, silicon nitride, polyimides, methylsilsesquioxane, hydrosilsesquioxane, polysilizanes, polycarbosilane, poly dimethylsiloxane, silylated polymers, polyimides, CORAL, Black Diamond, parylene, funtionalized parylene, Teflon, SILK, high Tg polymers, CVD polymer films, CVD inorganic films, SuCOH PECVD films. Other films include films deposited by PECVD from silane, monofunctional to multifunctional alkylsilanes, cyclic siloxane precursors, acetylene, any polymerizing chemistry, or films deposited from a mixture of precursors.

An important aspect of the choice of support materials and sacrificial material in the case of the SAAB process is the selectivity during the extraction of the sacrificial material. Chemical reactivity is one means to achieve this. For example, an organic polymer and silicon dioxide exhibit significant differences in etch rates when exposed to oxygen plasmas. Another example is the significant differences in etch rates achieved when etching materials of difference density (or porosity). A material that has a high degree of porosity will exhibit more rapid nominal etch rates than a denser (less porous) version of the same material. This density difference can be achieved in many ways such as different synthetic chemical routes, different processing conditions of an identical material, or even formulating the support and sacrificial material with different amounts of a porogen. Any material that gap fills is preferable in the SAIB and SAAB schemes.

The liner and cap materials are selected based on diffusion, electromigration, and thermal cycle compatibility. The fill metal is chosen based on resistivity, reliability, and manufacturability.

Although the invention has been described with respect to a limited number of embodiments, those skilled in the art will appreciate that other embodiments may be constructed within the spirit and scope of the following claims.

We claim:

1. A method comprising the following steps in the order named:

forming a dielectric layer on a substrate surface;

forming a plurality of line trenches each having a bottom in said dielectric layer;

depositing a dielectric bridge layer over a surface of said dielectric layer;

creating a via through at least one of said plurality of line trench bottoms extending through said dielectric layer;

depositing a conductive liner and a conductive fill metal into said at least one via and at least one of said plurality of line trenches; and extracting through said dielectric bridge layer a portion of said dielectric layer.

2. The method of claim 1 wherein each of said plurality of line trenches is separated by at least a ground rule distance.

3. The method of claim 1 wherein said dielectric bridge layer forms a mechanical link between at least two of said plurality of line trenches.

4. The method of claim 1 wherein said conductive liner and said conductive fill metal are planarized such that a top surface of said conductive fill metal is coplanar with atop surface of said dielectric bridge layer.

5. The method of claim 1 comprising the additional step of planarizing said conductive liner and said conductive fill metal with said dielectric bridge layer through a process selected from the group consisting of chemical polishing, mechanical polishing, and chemical-mechanical polishing.

6. A method according to claim 1, further comprising the step of forming a conformal dielectric sidewall layer within at least one of said plurality of line trenches.

7. A method according to claim 1 comprising the step of forming a plurality of fine holes each having a diameter less than a ground rule distance in said dielectric bridge layer prior to said extracting step.

8. A method according to claim 7 comprising the additional step of forming an air bridge by depositing a barrier dielectric and a layer of support dielectric on said dielectric bridge layer such that said plurality of fine holes is sealed off.

9. A method according to claim 7 wherein the formation of said plurality of fine holes is accomplished by a process selected from a group comprising lithography, diblock copolymer phase separation, reactive ion etching and combinations thereof.

10. A method according to claim 1 wherein said dielectric layer comprises a lower dielectric layer having a top surface coplanar with the bottom of one of said plurality of line trenches and an upper dielectric layer extending from said lower dielectric layer to said dielectric bridge layer and wherein said step of extracting said portion of said dielectric layer comprises extracting only said upper dielectric layer.

11. A method according to claim 1, in which said dielectric layer comprises a first dielectric layer having a top surface coplanar with said at least one of said plurality of line trench bottoms and extending laterally under said plurality of line trenches and a second dielectric layer extending from said substrate surface to said dielectric bridge layer outside said first dielectric layer wherein said step of forming said dielectric layer comprises the additional step of patterning said first dielectric layer laterally co-extensive with said plurality of line trenches and wherein said extracting step comprises extracting only said second dielectric layer.

12. A method according to claim 11 wherein said second dielectric layer is selected from the group consisting of polymethylmethacrylate, polybutadiene, polystryene, parylene, polyethylene oxide, poly urethanes and poly ureas, poly carbosilanes, poly silazanes, poly methylene oxide, poly(norborene), tetlon, polyethylene, poly (methyleneoxide), crosslinked unsaturated polymers, porous crosslinked polymers, linear polymers, branched polymers, hyperbranched polymers, dendritic polymers, aliphatic polymers, and aromatic polymers, diamond-like carbon (DLC), methylsilsesquioxanes, hydrosilsequioxanes, dimethylsiloxanes, functionalized dimethylsiloxanes, and inorganic polymers, inorganic glasses, and spin-on-glasses.

13. A method according to claim 1 wherein said dielectric layer comprises a single layer of extractable dielectric and said extracting step comprises extracting said single layer from under said trench bottom surface.

14. A method according to claim 1, wherein said step of forming said dielectric layer comprises the steps of:
   forming a plurality of interconnect apertures in said dielectric layer and filling said plurality of interconnect apertures with a support dielectric; and
   forming said plurality of line trenches and said at least one via in said support dielectric.

15. A method according to claim 14, comprising the additional steps of:
   recessing said support dielectric to a via depth; and
   forming said at least one via in said recessed support dielectric.

16. A method according to claim 14 wherein the material for said support dielectric is selected from the group consisting of cross linked organic dielectrics, thermoplastic organic dielectrics; diamond like carbon; silicon dioxide, PECVD low k dielectrics containing Si,C,O and H in amorphous form; spin on glasses including at least methylsilsesquioxanes, hydrosilsequioxanes, or mixed silsesquioxanes; and porous versions of all of the above materials.

17. A method according to claim 1 wherein said dielectric bridge layer is selected from a group comprising silicon dioxide, silicon carbide, silicon nitride, silicon carbonitride, methylsilsesquioxane, hydrosilsesquioxane, parylene, funtionalized parylene, polysilizanes, polycarbosilane, poly dimethylsiloxane, silylated organic polymers, polyhalocarbons, polyflurocarbons, tetraethyl-ortho-silicate, spin-on-glasses, CVD polymer films and combinations thereof.

18. The method according to claim 1, wherein said dielectric layer is selected from the group consisting of both solid and porous spin on glasses including at least methyl silsesquioxane, hydrido silsesquioxane, and mixed silsesquioxanes, amorphous hydrogenated dielectric films including silicon and at least one of carbon, hydrogen, oxygen and nitrogen, spin on organic dielectrics including at least polyimides, benzocyclobutene, polybenzoxadoles and aromatic thermoset polymers based on polyphenylene ethers, chemical vapor deposited polymers including at least poly paraxylylene, and combinations thereof.

19. A method according to claim 1 wherein the extraction of said portion of said dielectric layer is achieved by a process selected from the group consisting of wet etching, plasma etching, reactive ion etching, thermal pyrolysis, photon mediated decomposition, ion mediated decomposition, electron mediated decomposition, supercritical fluid extraction means, and combinations thereof.

* * * * *